(12) United States Patent
Moest

(10) Patent No.: US 7,583,359 B2
(45) Date of Patent: Sep. 1, 2009

(54) REDUCTION OF FIT ERROR DUE TO NON-UNIFORM SAMPLE DISTRIBUTION

(75) Inventor: Bearrach Moest, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 571 days.

(21) Appl. No.: 11/418,464

(22) Filed: May 5, 2006

(65) Prior Publication Data

US 2007/0258074 A1 Nov. 8, 2007

(51) Int. Cl.
 G03B 27/52 (2006.01)
 G03B 27/32 (2006.01)
 G01B 11/00 (2006.01)
(52) U.S. Cl. .............................. 355/55; 355/77; 356/400
(58) Field of Classification Search .................... 355/53, 355/55, 72, 75; 430/30; 702/94; 356/399, 356/400, 401
 See application file for complete search history.

(56) References Cited

U.S. PATENT DOCUMENTS

| | | | |
|---|---|---|---|
| 4,540,277 A | 9/1985 | Mayer et al. | |
| 5,229,872 A | 7/1993 | Mumola | |
| 5,296,891 A | 3/1994 | Vogt et al. | |
| 5,523,193 A | 6/1996 | Nelson | |
| 5,917,205 A | 6/1999 | Mitsui et al. | |
| 5,969,441 A | 10/1999 | Loopstra et al. | |
| 6,046,792 A | 4/2000 | Van Der Werf et al. | |
| 2003/0170552 A1* | 9/2003 | Miyashita et al. | 430/30 |
| 2005/0270509 A1* | 12/2005 | Ogushi et al. | 355/55 |

FOREIGN PATENT DOCUMENTS

| | | |
|---|---|---|
| WO | 98/33096 | 7/1998 |
| WO | 98/38597 | 9/1998 |
| WO | 98/40791 | 9/1998 |

\* cited by examiner

*Primary Examiner*—Peter B Kim
(74) *Attorney, Agent, or Firm*—Pillsbury Winthrop Shaw Pittman LLP

(57) ABSTRACT

A weighted fit based on a sample density of a plurality of samples is used to determine an alignment curve. A scan that produces the samples may include portions having greater and lesser sample density. While performing an interpolation to produce a best fit curve, a plurality of neighboring samples are chosen for each sample point, for sample points associated with a value above a threshold. A weighting function may be performed based on a distance between a given sample and the chosen nearest neighbors, wherein measurements that are taken in a region with denser samples are given less weight than measurements that are taken in a region with sparser samples.

27 Claims, 7 Drawing Sheets

REDUCTION OF FIT ERROR DUE TO NON-UNIFORM SAMPLE DISTRIBUTION

FIELD OF THE INVENTION

The invention relates to a system and method of alignment in a lithographic apparatus.

BACKGROUND OF THE INVENTION

The invention is directed to the field of lithographic projection apparatus that encompass a radiation system for supplying a projection beam of radiation, a support structure for supporting a patterning device, which serves to pattern the projection beam according to a desired pattern, a substrate table for holding a substrate; and, a projection system for projecting the patterned beam onto a target portion of the substrate.

The term "patterning device" as employed here should be broadly interpreted as referring to devices that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. Examples of such patterning devices include:

- A mask. The concept of a mask is well known in lithography and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;
- A programmable mirror array. One example of such a device is a matrix-addressable surface having a visco-elastic control layer and a reflective surface. The basic principle behind such an apparatus is that addressed areas of the reflective surface reflect incident light as diffracted light, for example, whereas unaddressed areas reflect incident light as non-diffracted light. Using an appropriate filter, the non-diffracted light can be filtered out of the reflected beam leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic circuitry.

In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and

- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as set forth here above.

Lithographic projection apparatus can be used, for example, in the manufacture of integrated circuits (ICs). In that case, the patterning device may generate a circuit pattern corresponding to an individual layer of the IC. This pattern can be imaged onto a target portion (e.g. comprising one or more dies) of a substrate (silicon wafer) that has been coated with a layer of radiation-sensitive material (resist). In general, a single wafer will contain a whole network of adjacent target portions that are successively irradiated via the projection system, one at a time. In current apparatus that employ patterning by a mask on a mask table, a distinction can be made between two different types of machines. In one type of lithographic projection apparatus, each target portion is irradiated by exposing the entire mask pattern onto the target portion in one exposure. Such an apparatus is commonly referred to as a wafer stepper or step-and-repeat apparatus.

In an alternative apparatus, commonly referred to as a step-and-scan apparatus, each target portion is irradiated by progressively scanning the mask pattern under the projection beam in a given reference direction (the "scanning" direction), while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an integrated circuit (IC). Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens". However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Furthermore, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of integrated circuits, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In this document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), among others.

For lithographic processing, the location of patterns in subsequent layers on the wafer should be as precise as possible for a correct definition of device features on the substrate, which features all should have sizes within specified tolerances. The overlay should be within well-defined tolerances for creating functional devices. To this end, the lithographic projection apparatus comprises an overlay measurement module which provides for determining the overlay of a pattern on the substrate with a mask pattern, as defined in a resist layer on top of the pattern.

The overlay system typically performs the measurement by optical elements. The position of the mask pattern relative to the position of the pattern located on the substrate is determined by measuring an optical response from an optical marker that is illuminated by an optical source. The signal generated by the optical marker is measured by a sensor arrangement. The overlay may be derived from output of the sensors.

Optical markers are used during microelectronic device processing (or IC processing) along the full manufacturing line. During the front end of line (FEOL), markers are used for overlay during manufacturing of transistor structures, for example. At a later stage during the back end of line (BEOL), markers are needed for overlay of metallization structures, e.g. connect lines, and vias. It is noted that in both cases, the integrity of the markers should be sufficient to meet the required accuracy of overlay.

In conventional systems, marker structures for overlay control are present in some area(s) of a substrate to allow for controlling the overlay of a mask pattern in a resist layer (after exposure and development), with further patterns already present on the substrate. A known structure for overlay control is a so-called overlay metrology target, which may include a first structure having four rectangular blocks and constituent parts that are arranged with their length along one of the sides of an imaginary square, and a second structure similar to, but smaller than, the first structure. To determine the overlay of patterns in two successive layers, one of the first and second structures is defined in the pattern in the first successive layer and the other one of the first and second structures is defined in the pattern in the resist layer for the second successive layer. In use, for both of the first and second structures, the position (e.g., the gravity centre) is determined for example, by detection of the edges of the respective rectangular blocks within the first and second structures, or using a correlation technique with respect to a reference target. From the difference in the centre of gravity position of the first and second structures, the overlay of the two structures is determined. It is noted that in conventional systems, other overlay metrology targets, such as a box-in-box target, are also known.

It is generally recognized that, for proper processing, the constituent parts of a marker structure should include a same material as (parts of) the device features and the dimensions should be similar to the dimensions of features of microelectronic devices. Maintaining similar dimensions avoids size-induced deviations that occur during processing of integrated circuits, which may result from a micro-loading effect during a reactive ion etching process. Size-induced deviations may occur at device structures that are in the vicinity of a large marker area or may result from size dependency of chemical-mechanical polishing (CMP) of structures.

U.S. Pat. No. 5,917,205 discloses photo-lithographic alignment marks based on circuit pattern features. Alignment marker structures are mimicked by a plurality of sub-elements which are ordered in such a way that their envelope corresponds to the marker structure. Furthermore, each sub-element has dimensions comparable to a critical feature size of a microelectronic device. Basically, the solution to marker size induced processing deviations is to "chop up" a large marker into many small-sized sub-elements which resemble features of a device (or "product"). Other drawbacks exist with known systems.

Overlay control may be improved using a system and method of measuring a location of an aerial image of an object mark in space.

SUMMARY OF THE INVENTION

One aspect of the invention provides systems and methods of improving overlay control by employing transmission image sensor alignment to reduce overlay errors in a projection system of a lithographic projection apparatus. In particular, systems and methods are provided for improving the accuracy of alignment positions determined from measurements using transmission image sensors of which the samples may be spatially non-uniform distributed.

Another aspect of the invention improves efficiencies associated with aligning overlay metrology targets. According to one embodiment, an alignment curve is provided from samples (data points) taken using a linear velocity, the alignment curve having a central portion with a maximum. The alignment curve is a curve based on data points that represent measured radiation intensity as a function of position, whose peak position is used to determine a condition of maximum alignment. A weighing function may be performed on the alignment curve that is based on a distance between a given sample and the nearest neighbors, wherein measurements that are taken in a region with denser samplings are given less weight than measurements that are taken in a region with sparser samplings. The invention thus provides a weighted fit for non-uniform sample distributions based on distances between a given sample and a nearest neighbour. The weighted fit produces an alignment curve that is a best fit curve whose peak position more closely approximates a position of maximum value based on the data points. This maximum value can represent, for example, the maximum radiation intensity recorded as a function of alignment sensor position for a nominally linear velocity scan whose velocity fluctuates during the scan, causing fluctuations in spacing between data points.

Another aspect of the invention also provides systems for aligning the overlay marks during an imaging process, the system includes a mask, a projection system, and a control system that is adapted to control and adjust machine parameters during execution of an imaging process. The control system may include a host processor, a memory for storing instructions and data, and an input/output device for handling signals transmitted to and received from actuators and sensors in the projection system, wherein the host processor is connected to the memory for processing the instructions and data and to the input/output device for controlling signals.

Another aspect of the invention further provides a computer program product to be loaded by the system for aligning the overlay marks during an imaging process, the system includes a mask, a projection system, and a control system adapted to control and adjust machine parameters during execution of an imaging process. The control system may include a host processor, a memory for storing instructions and data, and an input/output device for handling signals transmitted to and received from actuators and sensors in the projection system, the host processor being connected to the memory for processing the instructions and data and to the input/output device for controlling signals.

A further aspect of the invention also provides a lithographic projection system that includes a radiation system for providing a projection beam of radiation, a support structure for supporting a patterning device, wherein the patterning device serves to pattern the projection beam according to a pattern, a substrate table for holding a substrate, and a projection system for projecting the patterned beam onto a target portion of the substrate.

DETAILED DESCRIPTION OF THE EMBODIMENTS OF THE INVENTION

Figure 1:
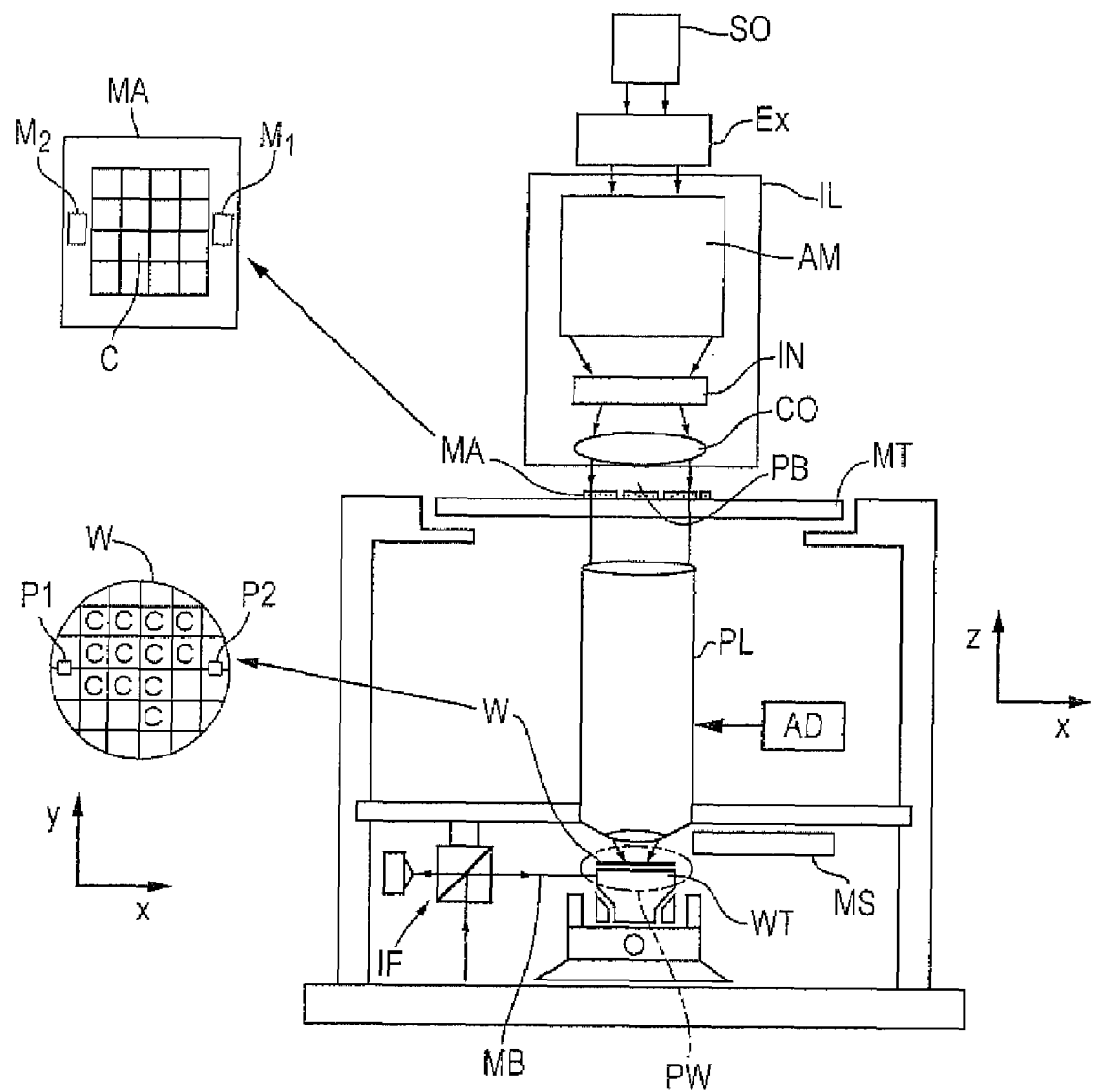
FIG. 1 illustrates a lithographic projection apparatus that includes at least one marker structure.

FIG. 1 schematically depicts lithographic projection apparatus that includes at least one marker structure in accordance with an embodiment of the invention. The apparatus includes:
- an illumination system IL for providing a projection beam PB of radiation (e.g. UV or EUV radiation). In this particular case, the radiation system also includes a radiation source SO;
- a first support structure MT (e.g. a mask table) for supporting a patterning device, MA (e.g. a mask) and connected to a first positioner (not shown) for accurately positioning the patterning device with respect to item PL;
- a second support structure WT (e.g. a wafer table) for holding a substrate, W (e.g. a resist-coated silicon wafer) and connected to a second positioner PW for accurately positioning the substrate with respect to item PL; and
- a projection system PL (e.g. a reflective projection lens) for imaging a pattern imported to the projection beam PB by patterning device MA onto a target portion C (e.g. comprising one or more dies) of the substrate W.

The projection system PL is provided with an actuating device AD for adjusting settings of the system. The operation of adjusting settings will be explained hereinafter in more detail.

As depicted here, the apparatus is of a transmissive type (i.e. has a transmissive mask). However the apparatus may alternatively be of a reflective type (with a reflective mask). Alternatively the apparatus may employ another kind of patterning device, such as a programmable mirror array of a type as referred to above.

The source SO (e.g. a mercury lamp or an excimer laser) produces a beam of radiation. This beam is fed into an illumination system (illuminator) IL, either directly or after having traversed conditioning elements, such as a beam expander Ex, for example. The illumination system IL further conditions the beam, and may include adjustable optical elements AM for setting the outer and/or inner radial extent (commonly referred to as σ-outer and σ-inner, respectively) of the intensity distribution of the beam PB. In addition, it will generally include various other components, such as an integrator IN and a condenser CO. In this way, the beam PB impinging on the mask MA includes a desired uniformity and intensity distribution in its cross-section.

It should be noted with regard to FIG. 1 that the source SO may be within the housing of the lithographic projection apparatus (as is often the case when the source SO is a mercury lamp, for example). Alternatively, the source SO may be remote from the lithographic projection apparatus, the beam which it produces being led into the apparatus (e.g. with the aid of suitable directing mirrors). This latter scenario is often the case when the source SO is an excimer laser. The invention is applicable to both of these scenarios.

The beam PB is incident on the mask MA, which is held on the mask table MT. Having traversed the mask MA, the beam PB passes through the lens PL, which focuses the beam PB onto a target portion C of the substrate W. With the aid of the second positioner PW and interferometer IF, the substrate table WT can be moved accurately, e.g. so as to position different target portions C in the path of the beam PB. Similarly, the first positioner (acting on the mask table MT) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly shown in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT and the substrate table WT are kept essentially stationary and an entire pattern imported to the beam PB is projected in one operation (i.e. a single "flash") onto a target portion C. The substrate table WT is then shifted in the X and/or Y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a non-illustrated variant embodiment, the substrate table may be replaced by a twin-scan arrangement that includes two scan stages to which the wafers are supplied successively. While one of the wafers is being exposed in one or other of the different modes described above, another of the wafers is being subjected to the necessary measurements to be carried out prior to exposure, with a view to decreasing the amount of time that each wafer is within the exposure zone and thus increasing the throughput of the system. More generally, the lithographic apparatus may be of a type having two or more substrate tables (and/or two or more mask tables). In such multiple stage machines, the additional tables may be used in parallel or preparatory steps may be carried out on one or more tables while one or more other tables are being used for exposure.

The interferometer typically includes a light source, such as a laser (not shown), and one or more interferometers for determining some information (e.g. position, alignment, etc.) regarding an object to be measured, such as a substrate or a stage. In FIG. 1, a single interferometer IF is schematically depicted by way of example. The light source (laser) produces a metrology beam MB which is routed to the interferometer IF by one or more beam manipulators. In a case where more than one interferometer is provided, the metrology beam may be shared between them, by using optics that split the metrology beam into separate beams for the different interferometers.

A substrate alignment system MS for aligning a substrate on table WT with a mask on mask table MT is schematically shown at an exemplary location close to the table WT, and includes at least one light source which generates a light beam aimed at a marker structure on the substrate W and at least one sensor device that detects an optical signal from that marker structure. It is to be noted that the location of the substrate alignment system MS depends on design conditions that may vary with the actual type of lithographic projection apparatus.

Figure 2:
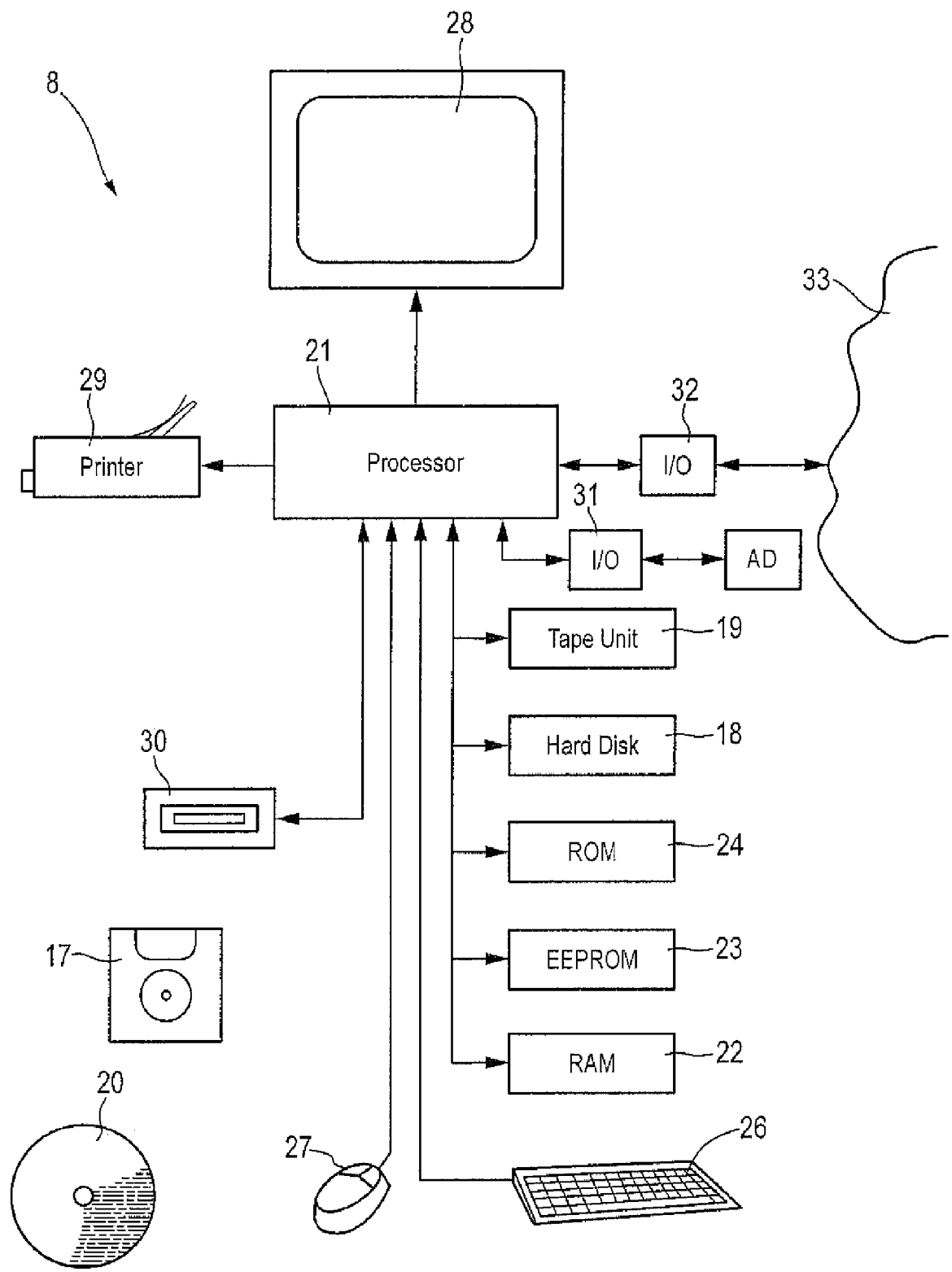
FIG. 2 schematically illustrates a computer arrangement according to one embodiment of the invention.

Furthermore, the lithographic projection apparatus includes an electronic control system that is capable of controlling and adjusting machine setting during execution of an imaging and exposure process. An exemplary electronic control system is schematically illustrated in FIG. 2. It is noted that the lithographic projection apparatus includes sophisticated computing resources for controlling functions of the lithographic projection apparatus with high accuracy. FIG. 2 illustrates only the functionality of the computing resources in relation to the invention. The computing resources may include additional systems and subsystems which are not illustrated here.

Machine setting may be adjusted to compensate for focus offset by displacing the projected image in the vertical (z) direction. Alternatively, machine setting may be adjusted to improve alignment by laterally shifting the image position in the horizontal plane (the x,y-plane).

One or more transmission image sensors (TIS) may be used to determine the lateral position and best focus position (i.e. horizontal and vertical position) of an image projected from the mask under the projection lens. Transmission image sensors (TIS) may be inset into a physical reference surface that is associated with the substrate table (WT). According to one embodiment, two sensors may be placed on fiducial plates at diagonally opposite positions outside the area covered by the wafer W. The sensor may be mounted to the substrate-bearing surface of the substrate table (WT) and may be used to directly determine the vertical and/or horizontal positions of the aerial image of the projected image.

The TIS is a measurement instrument that measures a location of an aerial image of an object mark in space and that measures a shape of the aerial image. The object mark may be placed on a reticle or on a reticle stage fiducial. The location information may be used to mathematically couple the reticle to the substrate table. The location information may be used to expose images on the substrate that are located at a best-focus (BF) position (z-position) and in a correct lateral position (overlay). The information regarding the shape of the aerial image may be used for machine set up, calibration and monitoring.

The best-focus (BF) position, i.e. z-position of the image, can be measured using the actual lithographic projection apparatus. The best-focus position is the z-position with maximum contrast, for example the position as defined by the maximum of a sixth-order polynomial fit to the contrast-versus-position curve as the position is moved from defocus, through focus and on to defocus. The best-focus can be determined experimentally using known techniques, such as by directly measuring the aerial image, for example, by using a transmission image sensor (TIS) (described below) or by using other techniques.

In order to determine the position of the focal plane, the projection lens may be configured to project an image of a pattern provided on the mask MA (or on a mask table fiducial plate) into space, wherein the image may include contrasting light and dark regions. The substrate stage may be scanned horizontally (in one or possibly two directions, e.g. the x and y directions) and vertically so that the aperture of the TIS passes through the space where the aerial image is expected to be. As the TIS aperture passes through the light and dark portions of the image of the TIS pattern, the output of the photodetector fluctuates (a Moiré effect).

The relative stage positions of the TIS aperture, at which the rate of change of amplitude of the photodetector output during the horizontal scan is highest, are indicative of the aerial lateral position of the image. An example of a TIS detection arrangement of this type is described in greater detail in U.S. Pat. No. 4,540,277 incorporated herein by reference.

Figure 3:
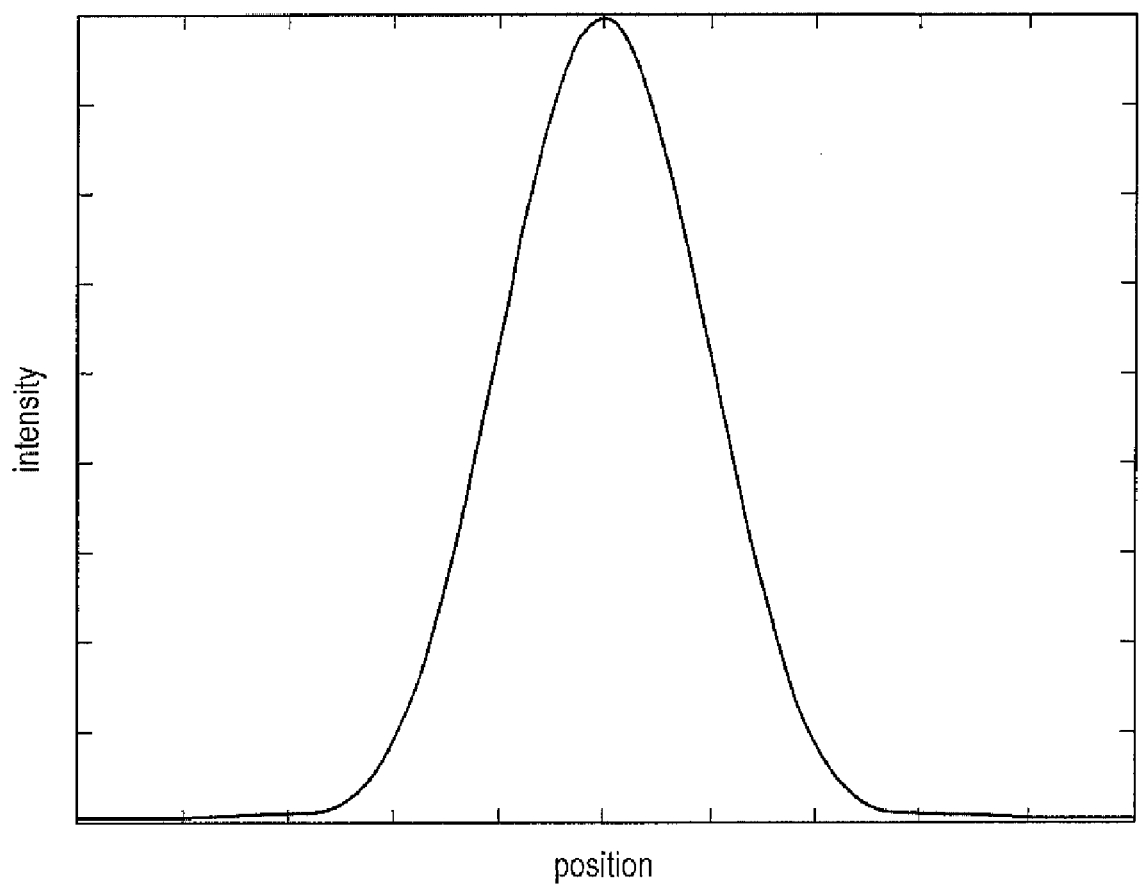
FIG. 3 illustrates a one-dimensional intensity vs. position graph generated by a transmission image sensor.

According to one embodiment, signals associated with a .TIS-sensor mark may be generated as one-dimensional (1-D) scans or as two-dimensional (2-D) scans. Regarding 1-D scans, FIG. 3 illustrates a graph of TIS intensity as a function of position. For example, FIG. 3 could represent a 1-D scan for horizontal scans that are performed at a best-focus position or a vertical scan at the best horizontally aligned position. According to one embodiment, a 2-D scan may be performed that is a combination of a scan both in the horizontal plane (x-y direction) and in the vertical plane (x, y-z direction). For the 1-D, scan a vertical scan may be performed at the best horizontal aligned position. According to yet another embodiment, a horizontal scan may be performed in the x,y or diagonal direction at one z-level. Signals from selected TIS gratings may be used for a fit, wherein the fitting procedure fits a 1-D parabola through points above a predetermined threshold. The term "samples", as used hereinafter, denotes sample points or data points that can be collected during a measurement and that can be represented by a sample position and a sample value. For example, a series of data points used to produce a parabolic curve may be termed a series of "samples." At both sides of the scan, a scan range may be provided that acquires fewer samples (i.e., a sparse sample length) to ensure that a minimum intensity is found during the scan.

Figure 4:
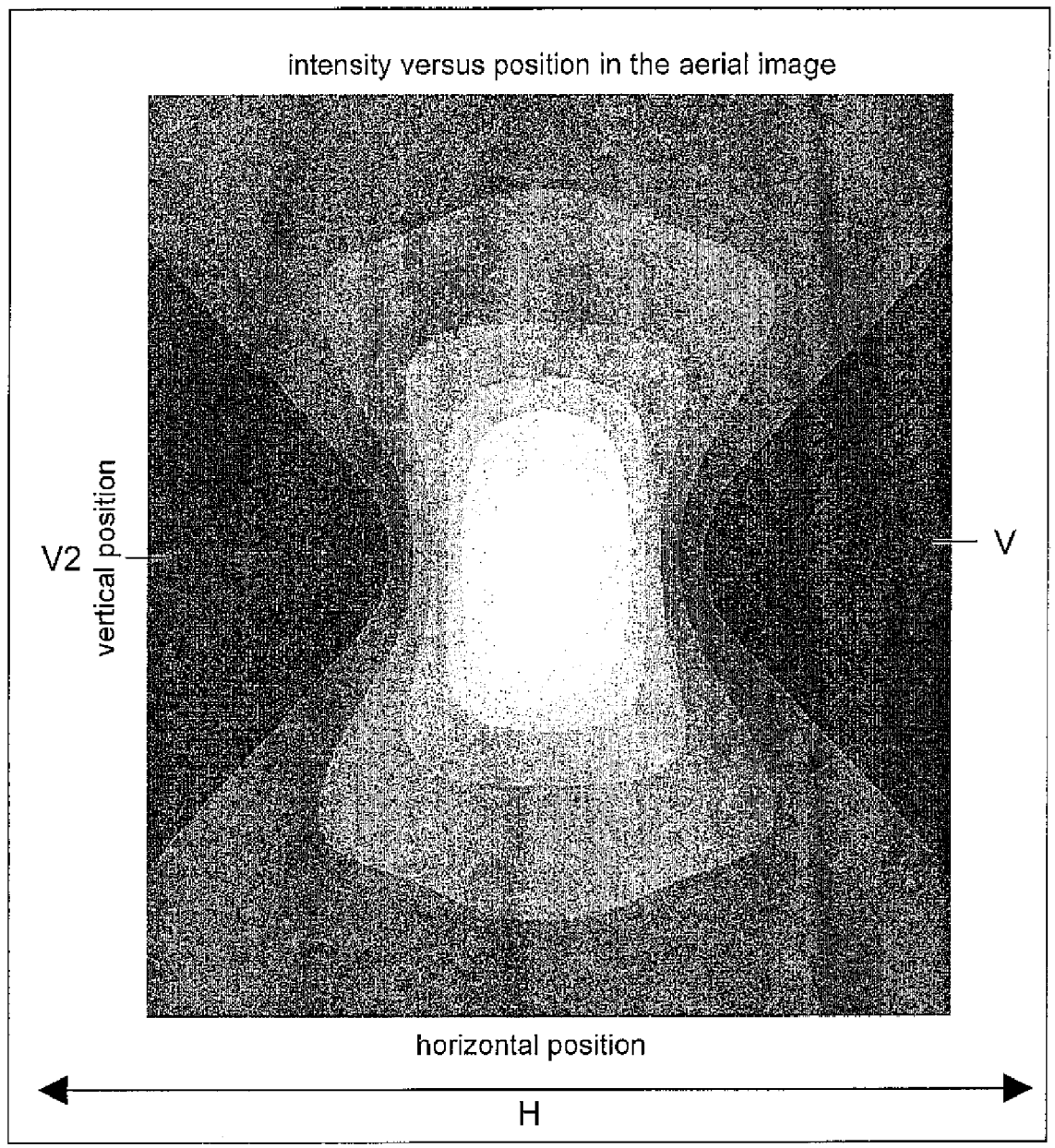
FIG. 4 illustrates a 2-D scan that can be used to determine the horizontal and vertical aligned (best focus) position of a transmission image sensor.

According to one embodiment, FIG. 3 illustrates a horizontal scan having a central portion that includes samples taken with a linear velocity applied to the wafer table. The peak of the central portion of the scan corresponds to a position of the maximum alignment on the TIS sensor. As discussed further below, according to one embodiment, a weighting function may be performed based on a distance between a given sample and the nearest neighbors, wherein measurements that are taken in a region with denser samplings are given less weight than measurements that are taken in a region with sparser samplings. The terms "dense samples" or "dense samplings", as used herein, refer to samples that are more closely spaced as opposed to "sparse samples." In one embodiment of the present invention, the horizontal scan represented by FIG. 3 is performed when the TIS is located at a best-focus (BF) position, i.e. z-position of the image corresponding to a vertical distance of best focus, where the vertical distance can be determined with respect to a plane containing a reticle, for example. Thus, during the horizontal scan, a TIS mask portion travels within a horizontal plane of best focus (or "plane of best focus"). The plane of best focus can be determined, for example, by a position of maximum intensity of radiation detected by a TIS sensor as the TIS mask portion travels in a vertical direction z indicted in FIG. 1. For example, FIG. 4 shows results of a 2-D scan of a signal on a TIS sensor mark for a combination capture scan. According to one embodiment, a combination capture scan is a combination of a horizontal and a vertical scan. The contours in FIG. 4 represent intensity contours measured by the TIS, such that the white region represents locations of maximum intensity. Thus, a vertical position at about point V can be used as a BF position. Accordingly, the scan of FIG. 3 could be performed along the H direction over a portion of a line connecting V and V2.

Figure 5A:
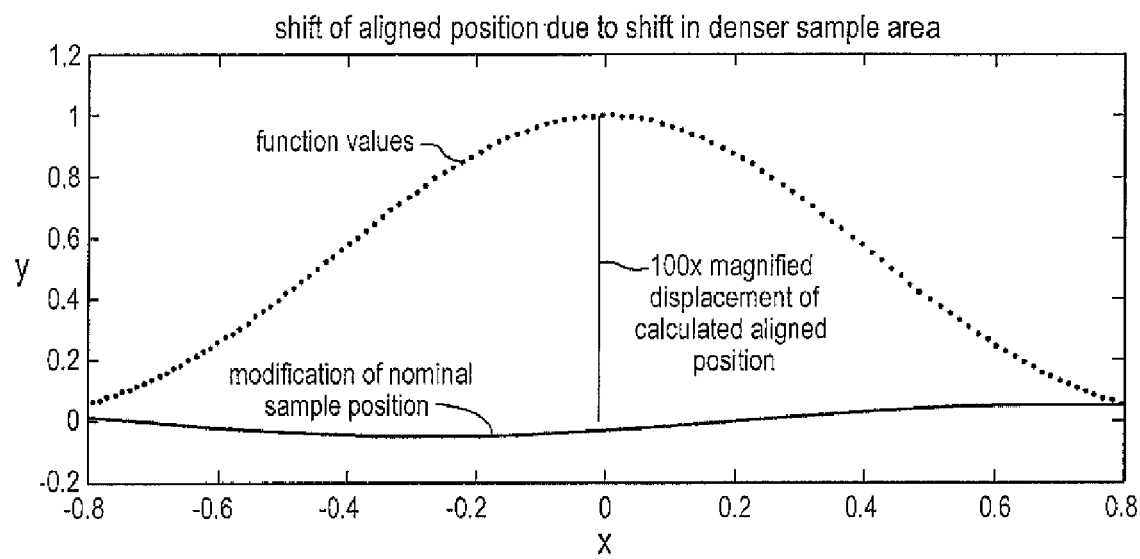
FIGS. 5a and 5b contain exemplary sample distributions where the sample densities vary slowly along an X-direction.

FIGS. 5a-6b are exemplary 1-D scans that are used to illustrate sampling operation of embodiments of the present invention. In FIGS. 5a and 5b, a series of data points is plotted as a function of x position. Y values can represent intensity of light signal received at a TIS sensor, for example. The x values could represent position on a sample stage, such as a wafer table. In many measurement schemes used to perform alignment, for example, a sample point is recorded (a radiation intensity measurement is performed) at regular intervals as a servo motor drives a stage. The stage can be driven in a horizontal "x" direction, for example. Sample points are often recorded at regularly spaced distances in the x direction. However, actual variations in translation speed of a stage from a nominal speed cause fluctuations in the actual spacing of data points, as illustrated in FIGS. 5a-6b. FIGS. 5a and 5b illustrate the case in which a slow perturbation of sample spacing occurs as a function of X position. In other words, the spacing along the x-direction of neighboring data points slowly expands and contracts from points −0.8 to 0.8. In addition, the overall density of sample points can be different in the −X region from the +X region.

Figure 5B:
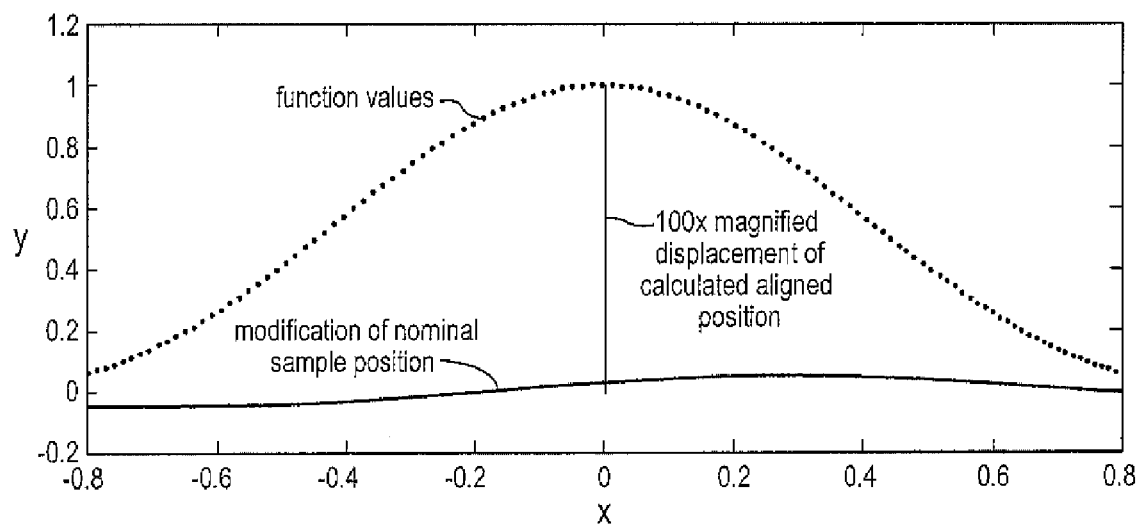

Alignment can be determined based on the x-position of maximum Y value that corresponds to a peak in radiation intensity. In a typical procedure, a fit is performed to produce a curve from which the maximum Y value and corresponding X position (alignment position) can be determined. Many functions can be used to model the sample data to produce a best fit to be used to determine the alignment position. In FIGS. 5a-6b, an example of the use of a sine function to model the data is shown. The slow varying perturbation of the sample positions in FIGS. 5a and 5b correspond to a relative frequency=1, where the relative frequency is a measure of the period of the perturbation with respect to the period of the sample measurement. In the example of FIGS. 5a and 5b, the perturbation in relative spacing of a sample with respect to its neighbors obeys a slowly varying sine function. Since the relative frequency is 1, over the period corresponding to the full scan length, the sinusoidal perturbation in sample spacing also goes through one period. Thus, sample spacing starts out at a first value at the beginning of the scan and increases and decreases according to a sine function through one period, returning to the first value at the end of the scan. This slow varying perturbation could be used to approximate a slowly varying error in table speed during a nominally linear velocity scan.

The vertical line in FIGS. 5a and 5b illustrates a displacement of the calculated alignment position, based on the density perturbation applied. In the case of FIG. 5a, based on overall sample density, a slight shift in the negative X direction is observed, whereas in the case of FIG. 5b a slight shift in the positive X direction occurs. These differences (fit errors) indicate a shift in calculated alignment position from curve fitting with respect to a position of measured peak intensity.

Figure 6A:
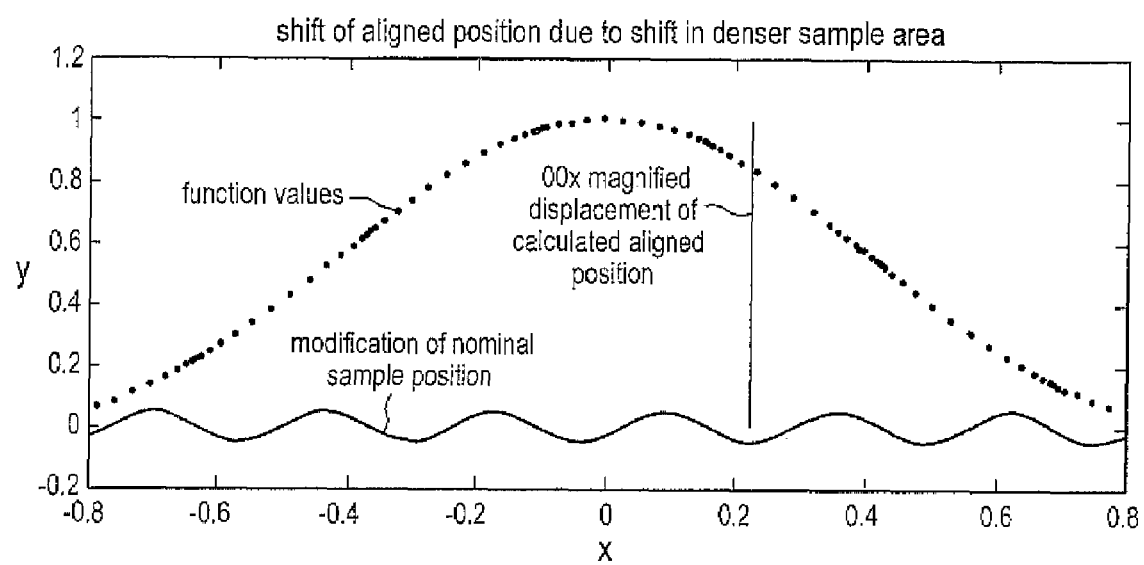
FIGS. 6a and 6b contain exemplary sample distributions where the sample densities vary rapidly along an X-direction.
Figure 6B:
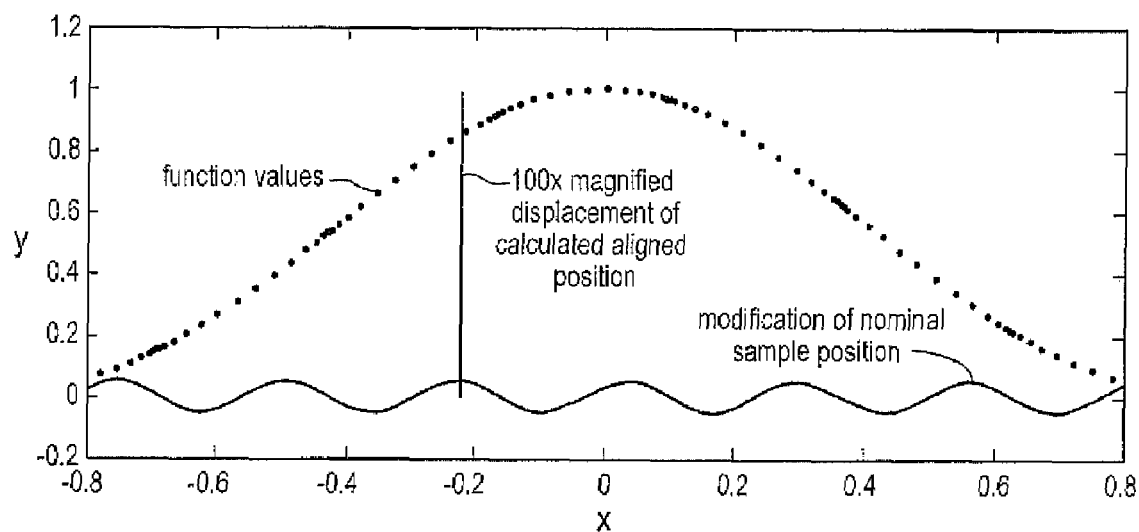

In FIGS. 6a and 6b, the relative frequency of the sinusoidal sample density perturbation is much greater (relative frequency=7.5, meaning 7.5 cycles of sinusoidal perturbation within a full scan from −1 to 1) than that of FIGS. 5a and 5b. In other words, the density of sample measurements along the X direction more rapidly expands and contracts between densely packed points and sparsely packed points. In this case, for the alternative sample distributions shown, the displacement of the calculated alignment position from peak intensity position is much greater, either in the −X or +X direction. Thus, the rapid fluctuation of sample density has a much larger effect on shifting the calculated alignment position.

In the examples of FIGS. 5a-6b, a best fit curve calculated for each series of data points will have a peak position that is shifted in the X-direction with respect to a position corresponding to a sample having maximum intensity. Depending on the relative rate at which the distance between data points varies, the fit error of a curve used to determine peak position can be larger or smaller, that is, the peak position of the best fit curve is shifted to a greater or lesser extent from the sample position of maximum intensity.

Figure 7:
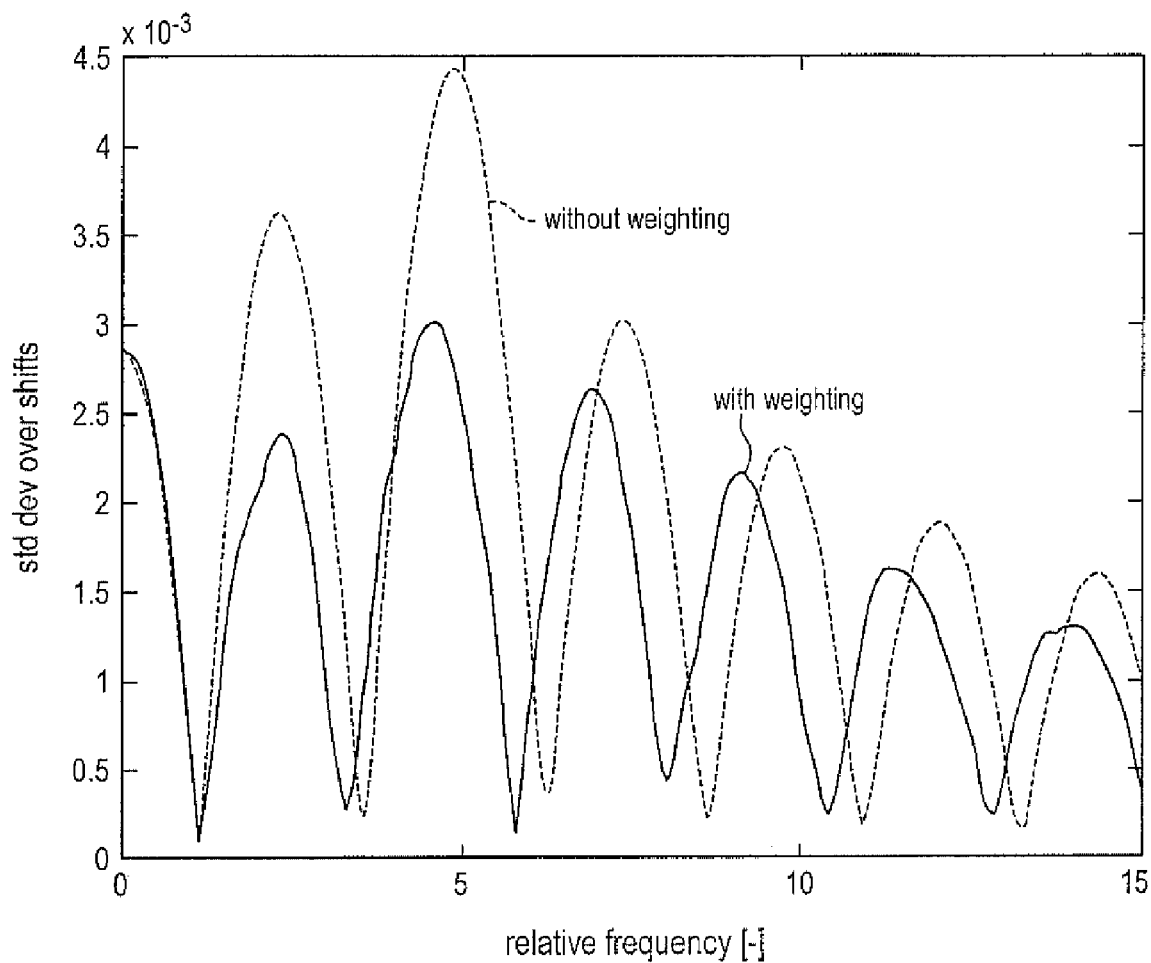
FIG. 7 contains exemplary curves illustrating the effect of use of a method according to one embodiment of the present invention.

FIG. 7 contains exemplary curves illustrating the effect of use of a method according to one embodiment of the present invention. Two curves are shown. The first curve shows the standard deviation of the translations due to different phase of the perturbations as a function of the frequency of the perturbation using the regular fit method. The standard deviation represents a good measure of fit error. In accordance with one embodiment of this invention, the second curve shows the standard deviation of the translations using on a weighted fit applied that accounts for non-uniform sample distributions based on distances between a given sample and a nearest neighbour. In this case the standard deviation (indicative of fit error) is generally smaller. Without the weighted correction of the present invention applied, the effect of sample density perturbations for curve fits based on sample measurements is clearly greater than when the weighted correction is applied, for the majority of the relative frequency range shown. Thus, for most of the possible frequencies of periodic perturbations to an ideal scan rate (of the relative frequency range shown) during a wafer scan, the present invention operates to produce a lower fit error in determining actual aligned position as opposed to non sample-density-weighted curve fit procedures. Furthermore, on average the sample-density-weighted fit errors are substantially less than the non-weighted fit errors over the relative frequency range shown.

Table I illustrates an exemplary routine for performing a weighted fit to sample data in accordance with embodiments of the present invention. After a weighting factor is applied to each sample based on a distance to nearest neighbors, a least squares linear fit is applied.

TABLE I

```
% generate sampling positions
  % prepare local dense/sparse sampling
  dx = 0.05 * sin(pi*(x1*fi(i)+pj(j)));
  x2 = x1 + dx;
  % Calculate function sinc^2
  f1 = sinc( x1 ).^2;
  f2 = sinc( x2 ).^2;
  % perform thresholding for quadratic fit
  ind1 = find( f1 > 0.5 );
  ind2 = find( f1 > 0.5 );
  % Set up fit matrices (quadratic)
  A1 = [ones(1,length(ind1)); x1(ind1)'; x1(ind1)'.^2];
  A2 = [ones(1,length(ind1)); x2(ind2)'; x2(ind2)'.^2];
  % Perform fit
  C1 = f1(ind1)'/A1;
  C2 = f2(ind2)'/A2;
  % Calculate "aligned position"
  ax1(i,j) = -C1(2) / (2*C1(3));
  ax2(i,j) = -C2(2) / (2*C2(3));
  % Perform weighted fit,
  % step 1, sort original x values;
  [x, ind] = sort(x2);
  % step 2, determine weight factor for each sample
  xx = abs(x * ones(1, length(x)) - ones(length(x),1) * x');
```

TABLE I-continued

```
  for cnt=1:length(x);
    tmp = sort(xx(cnt,:));
    tmp(1) = [ ];
    if (tmp(1) == 0)
      w(ind(cnt)) = 0;
    else
      % distance to nearest neighbours
        w(ind(cnt)) = mean( tmp(1:2) );
    end
  end;
  w = sqrt(0.2 + (w - min(w))/(max(w)-min(w)) ) ;
  % step 3, select only those samples according to threshold & perform fit
  f    = f2(ind2);
  w    = w(ind2);
  A2w = (ones(3,1)*w) .* A2;
  C2w = (w.*f') / A2w;
  % Calculate "aligned position" after weighted fit
  ax2w(i,j) = -C2w(2) / (2*C2w(3));
end
```

In an exemplary embodiment of the present invention, the data points chosen for generating an alignment curve correspond to those associated with a radiation intensity above a threshold value. Interpolation to produce the best fit curve (alignment curve) is performed using the data points whose radiation intensity exceeds the threshold, wherein a plurality of neighboring data points are selected for each data point, such that the weighting factors are adjusted based on the density of data points, as described above. Because samples far away do not contribute largely to the weighting, the amount of neighboring samples used can be limited to a relatively small number. Preferably, the amount of neighboring data points used in conjunction with each data point is less than about ten. In an exemplary embodiment of this invention, the amount of neighboring data points used is less than about five. Depending on variations in density of data points near the data point in question, the number of neighboring data points selected on one side of the data point may be the same as or differ from the number of data points selected on the other side of the data point. For example, during a TIS scan in which a nominally linear velocity is applied to a wafer table, a perturbation to the nominally linear velocity may result in a non-uniform distribution of data points as illustrated in FIG. 6a or 6b. Depending on the data point in question, a group of four nearest neighbour data points could be distributed, for example, two on each side or alternatively, three on one side and one on the opposite side, with respect to the given data point.

In one embodiment of this invention, where curve fitting is employed using a small number of neighboring data points for each data point, the data points can be collected during a wafer scan, such as a TIS scan, and an interpolation to produce an alignment curve can be performed in real-time or near real-time. Thus, an alignment curve determined based on a small amount of calculations for each data point, results in a reduction of time for an alignment operation as compared to known procedures involving more extensive calculations for each data point of a fit curve.

It is to be noted that the scope of this invention includes other functions besides sinusoidal functions that can be applied for determining a best fit curve based on a set of sample data whose spacing between data points is subject to variation. It is further to be noted that the procedure for determining a best fit curve described herein with respect to certain embodiments of this invention can be applied to systems other than those used in conjunction with alignment devices. The determination of a peak position of a fit curve based on non-uniform sample spacings (density) has applicability in many systems where the distribution of data points used for curve fitting varies from a uniform distribution.

FIG. 2 schematically illustrates a computer arrangement 8 as used in a particular embodiment of the invention that includes a host processor 21 with peripherals. The host processor 21 is connected to memory units 18, 19, 22, 23, 24 which store instructions and data, one or more reading units 30 (to read, e.g. floppy disks 17, CD ROM's 20, DVD's, etc.), input devices, such as a keyboard 26 and a mouse 27, and output devices, such as a monitor 28 and a printer 29. Other input devices, like a trackball, a touch screen or a scanner, as well as other output devices, may be provided.

An input/output (I/O) device 31 is provided for connection to the lithographic projection apparatus. The I/O device 31 is arranged for handling signals transmitted to and received from actuators and sensors, which take part in controlling projection system PL in accordance with the invention. Further, a network I/O device 32 is provided for a connection to a network 33.

The memory units include a RAM 22, an (E)EPROM 23, a ROM 24, a tape unit 19, and a hard disk 18. However, it should be understood that other memory units may be provided that are known to persons skilled in the art. Moreover, one or more of the memory units may be physically located remote from the processor 21. The processor 21 is shown as one box, however, it may comprise several processing units functioning in parallel or controlled by one main processor, that may be located remotely from one another, as is known to persons skilled in the art.

Furthermore, computer arrangement 8 may be located remotely from the location of the lithographic projection apparatus and may provide functions to the lithographic projection apparatus over a further network connection.

The projection system is provided with an actuating device AD which is capable of adjusting optical settings of the projection system by manipulating the optical elements and stage positions within the projection system. The actuating device AD is provided with input and output ports for exchanging control signals with a control system (not shown). The computer arrangement 8 of the invention is capable of controlling and adjusting the settings of the projection system in such a way that, during an exposure, the overlay displacement of features is made as low as possible. It should be noted that the computer arrangement 8 may receive status signals from the lithographic projection apparatus which relate to the status and/or the settings of the projection system and/or other parts of the lithographic projection apparatus. As will be appreciated by persons skilled in the art, the status signals may influence the timing and/or response of the electronic control system.

According to an embodiment, advanced process control (APC) systems may be used to provide good overlay. Based on the results of TIS measurements, the APC system may calculate overlay corrections, which are used to adjust the scanner to minimize the overlay error.

In accordance with one embodiment of the present invention, a method of generating an alignment curve in a lithography apparatus, the alignment curve based on determining a plurality of data points associated with an object that moves with a wafer table, wherein the data points include a position and radiation intensity associated with the position, is characterized by: performing an interpolation of the plurality of samples to produce a best fit curve; and adjusting a weighting assigned to the plurality of data points during the interpolation to provide less weight to the densely spaced data points and more weight to the sparsely spaced data points.

In accordance with another embodiment of this invention, a device for generating an alignment curve, the device including a mask table constructed and arranged to support a mask, a wafer table constructed and arranged to support a wafer, and a projection system, is characterized in that a control system of the device is configured (i) to generate a plurality of data points from radiation intensity measurements generated during a wafer scan, (ii) to perform an interpolation of the plurality of the data points to produce a best fit curve, and (iii) to adjust a weighting assigned to the plurality of data points during the interpolation to provide less weight to the densely spaced data points and more weight to the sparse data points.

In accordance with a further embodiment of the present invention, a method for controlling overlay in a lithography system, said method including performing a one dimensional (1-D) scan using an image sensor within a plane of best focus and generating a set of data points based the 1-D scan, each data point representing a measured intensity and position, is characterized by the steps of: generating a best fit curve based on a density-weighted fit applied to the set of data points; and determining a position of maximum intensity corresponding to optimum alignment based on a peak position of the best fit curve.

In accordance with another embodiment of this invention, a system for controlling overlay in a lithography apparatus, the system including a mask table constructed and arranged to support a mask, a wafer table constructed and arranged to support a wafer, an image sensor that moves in concert with the wafer table and is configured to determine an alignment position based on a peak in detected light intensity, and a projection system, is characterized in that a control system is configured (i) to generate a plurality of data points generated during a wafer scan using the image sensor, (ii) to perform an interpolation of the plurality of data points to produce a best fit curve, and (iii) to adjust a weight assigned to the plurality of data points during the interpolation to provide less weight to the dense data points and more weight to the sparse data points.

In accordance with a further embodiment of this invention, a method for reducing a fit error in a curve based on non-uniformly distributed data points, the method including generating a plurality of data points, each data point associated with a position and value, and performing an interpolation of the plurality of data points to produce a best fit curve, is characterized by: adjusting a weighting assigned to the plurality of data points during the interpolation to provide less weight to the densely spaced data points and more weight to the sparsely spaced data points.

While the preferred forms of the invention have been disclosed, it will be apparent to those skilled in the art that various changes and modifications may be made that will achieve some of the advantages of the invention without departing from the spirit and scope of the invention. It will be apparent to those reasonably skilled in the art that other components performing the same function may be suitably substituted. Further, the methods of the invention may be achieved in either all software implementations, using the appropriate processor instructions, or in hybrid implementations that utilize a combination of hardware logic and software logic to achieve the same results. Therefore, the scope of the invention is to be determined solely by the appended claims.

I claim:

1. An alignment method for a lithography apparatus, comprising:
   determining a plurality of data points associated with an object that moves with a wafer table, the data points including a position and radiation intensity associated with the position; and
   performing an interpolation of the plurality of data points to produce a best fit curve, wherein the performing the interpolation comprises adjusting a weighting assigned to the plurality of data points during the interpolation to provide less weight to the densely spaced data points and more weight to the sparsely spaced data points.

2. The method of claim 1, wherein the performing the interpolation further comprises:
   choosing a threshold value of radiation intensity;
   selecting a plurality of data points, wherein each data point corresponds to a radiation intensity above the threshold value; and
   choosing a plurality of neighboring data points near the each data point to perform the adjusting the weighting.

3. The method of claim 2, wherein the plurality of neighboring data points is less than about ten data points.

4. The method of claim 1, wherein movement of the object is characterized by a perturbation to a nominally linear velocity.

5. The method of claim 1, wherein performing the fit includes performing a parabolic interpolation.

6. The method of claim 1, wherein the object is one of a grating, a detector, and an image sensor.

7. The method of claim 1, wherein the plurality of data points is determined using transmitted image sensor marks of a transmitted image sensor.

8. The method of claim 1, wherein the best fit curve comprises a one-dimensional curve that includes the plurality of data points.

9. The method of claim 7, wherein a position of maximum alignment corresponds to a maximum intensity detected by the transmitted image sensor.

10. The method of claim 1, further comprising:
    calculating a peak position of the best fit curve; and
    determining the alignment position based on the peak position.

11. The method of claim 10, wherein the peak position of the best fit curve more closely approximates the position of maximum alignment than a peak position of a fit curve constructed without the adjusting the weighting assigned to the plurality of data points.

12. The method of claim 1, further comprising selecting a data point associated with a highest radiation intensity and two neighboring data points.

13. A device for generating an alignment curve in a lithographic apparatus, comprising:
    a mask table constructed and arranged to support a mask;
    a wafer table constructed and arranged to support a wafer;
    a projection system; and
    a control system configured (i) to generate a plurality of data points from radiation intensity measurements generated during a water scan, (ii) to perform an interpolation of the plurality of the data points to produce a best fit curve, and (iii) to adjust a weighting assigned to the plurality of data points during the interpolation to provide less weight to the densely spaced data points and more weight to the sparse data points.

14. The device of claim 13, wherein the control system is further configured to select the plurality of data points based on a radiation intensity threshold.

15. The device of claim 13, wherein the control system is configured to perform a parabolic interpolation.

16. The device of claim 13, wherein the control system is configured to generate a one-dimensional curve that includes the plurality of data points.

17. The device of claim 13, wherein the mask includes a transmission image sensor marker.

18. A method for controlling overlay in a lithography system, comprising: performing a one dimensional (1-D) scan using an image sensor within a plane of best focus;
    generating a set of data points based the 1-D scan, each data point representing a measured intensity and position;
    generating a best fit curve based on a density-weighted fit applied to the set of data points; and
    determining a position of maximum intensity corresponding to optimum alignment based on a peak position of the best fit curve.

19. The method of claim 18, further comprising determining a plane of best focus before performing the 1-D scan.

20. The method of claim 18, wherein the generating the best fit curve comprises according a greater weight to sparse data points than to dense data points.

21. The method of claim 18, wherein the image sensor is a transmitted image sensor.

22. A system for controlling overlay in a lithography apparatus, comprising:
    a mask table constructed and arranged to support a mask;
    a wafer table constructed and arranged to support a wafer;
    an image sensor that moves in concert with the wafer table and is configured to determine an alignment position based on a peak in detected light intensity;
    a projection system; and a control system configured (i) to generate a plurality of data points generated during a wafer scan using the image sensor, (ii) to perform an interpolation of the plurality of data points to produce a best fit curve, and (iii) to adjust a weight assigned to the plurality of data points during the interpolation to provide less weight to the dense data points and more weight to the sparse data points.

23. The system of claim 22, wherein the system is further configured to select the plurality of data points based on a radiation intensity threshold.

24. The system of claim 22, wherein the image sensor is a transmitted image sensor.

25. The system of claim 22, wherein the image sensor is further configured to detect a best focus condition based on a vertical scan.

26. The system of claim 22, wherein the plurality of data points are characterized by a perturbation in sample spacing, the perturbation having a relative frequency corresponding to deviations of wafer table speed from a nominal speed during the wafer scan.

27. The system of claim 26, wherein the relative frequency is less than about twenty, and wherein fit errors using the interpolation to provide less weight to the dense data points and more weight to the sparse data points are on average less than fit errors determined without the interpolation.

* * * * *